United States Patent
Ikeda et al.

(10) Patent No.: US 10,061,720 B2
(45) Date of Patent: Aug. 28, 2018

(54) STORAGE SYSTEM AND SIGNAL TRANSFER METHOD

(71) Applicant: HITACHI, LTD., Tokyo (JP)

(72) Inventors: Yasuhiro Ikeda, Tokyo (JP); Satoshi Muraoka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 135 days.

(21) Appl. No.: 15/114,424

(22) PCT Filed: May 16, 2014

(86) PCT No.: PCT/JP2014/063056
§ 371 (c)(1),
(2) Date: Jul. 27, 2016

(87) PCT Pub. No.: WO2015/173946
PCT Pub. Date: Nov. 19, 2015

(65) Prior Publication Data
US 2017/0220492 A1 Aug. 3, 2017

(51) Int. Cl.
*G06F 13/16* (2006.01)
*G06F 13/40* (2006.01)
*G11C 29/10* (2006.01)
*G11C 29/12* (2006.01)
*G11C 29/02* (2006.01)
(Continued)

(52) U.S. Cl.
CPC ........ *G06F 13/1668* (2013.01); *G06F 13/102* (2013.01); *G06F 13/4022* (2013.01); *G06F 13/4068* (2013.01); *G06F 13/42* (2013.01); *G11C 7/1063* (2013.01); *G11C 29/028* (2013.01); *G11C 29/10* (2013.01);
(Continued)

(58) Field of Classification Search
CPC ............ G06F 13/1668; G06F 13/4022; G06F 13/4068; G06F 13/42; G06F 13/102; G11C 29/10; G11C 29/028; G11C 29/12005; G11C 29/24; G11C 7/1063; H04L 25/02; H04L 25/03
USPC .................................. 714/719, 718, 721, 724
See application file for complete search history.

(56) References Cited

U.S. PATENT DOCUMENTS

| | | | | |
|---|---|---|---|---|
| 6,438,159 B1 * | 8/2002 | Uber | ................... | G06F 13/4086 375/225 |
| 8,049,537 B2 * | 11/2011 | Pagnanelli | .......... | H04L 25/0278 327/108 |

(Continued)

FOREIGN PATENT DOCUMENTS

| JP | 2000-078209 A | 3/2000 |
|---|---|---|
| JP | 2001-222474 A | 8/2001 |

(Continued)

*Primary Examiner* — John J Tabone, Jr.
(74) *Attorney, Agent, or Firm* — Volpe and Koenig, P.C.

(57) ABSTRACT

A storage system includes a controller part, a data storage part, and a transfer path of a signal that couples these parts. A driver included in the controller part transmits the signal including write data on the basis of a configured parameter, a receiver included in the data storage part receives the signal, and the write data included in the signal is written into a first storage area. The controller part reads the write data from the first storage area, determines whether or not a bit error exists in the write data, changes the parameter when the bit error exists to repeat similar determination and find an appropriate parameter at which the bit error no longer exists.

13 Claims, 7 Drawing Sheets

(51) Int. Cl.
  *G06F 13/42* (2006.01)
  *G06F 13/10* (2006.01)
  *G11C 29/24* (2006.01)
  *G11C 7/10* (2006.01)
  *H04L 25/02* (2006.01)
  *H04L 25/03* (2006.01)
(52) U.S. Cl.
  CPC ........ *G11C 29/12005* (2013.01); *G11C 29/24* (2013.01); *H04L 25/02* (2013.01); *H04L 25/03* (2013.01)

(56) References Cited

U.S. PATENT DOCUMENTS

| | | | | |
|---|---|---|---|---|
| 9,320,103 | B2* | 4/2016 | Lee | H05B 33/0851 |
| 9,419,746 | B1* | 8/2016 | Baeckler | H04L 1/0001 |
| 9,568,548 | B1* | 2/2017 | Franch | G01R 31/2882 |
| 9,676,357 | B2* | 6/2017 | Dittfeld | B60R 21/0173 |
| 2001/0030561 | A1 | 10/2001 | Asano et al. | |
| 2006/0233201 | A1* | 10/2006 | Wiesenthal | H04L 1/0014 370/477 |
| 2009/0067298 | A1* | 3/2009 | Kim | G11B 7/09 369/44.11 |
| 2010/0026203 | A1* | 2/2010 | Zhao | H05B 33/0815 315/291 |
| 2011/0102073 | A1 | 5/2011 | Riho | |
| 2014/0292378 | A1* | 10/2014 | Suzuki | H03K 19/0005 327/108 |
| 2015/0222361 | A1* | 8/2015 | Dhaini | H04J 14/0282 398/66 |
| 2015/0257230 | A1* | 9/2015 | Lee | H05B 33/0851 315/186 |
| 2016/0181874 | A1* | 6/2016 | Raveh et al. | H02J 5/005 307/104 |

FOREIGN PATENT DOCUMENTS

| | | |
|---|---|---|
| JP | 2006-148389 A | 6/2006 |
| JP | 2011-101143 A | 5/2011 |
| WO | 2014/049752 A1 | 4/2014 |

* cited by examiner

STORAGE SYSTEM AND SIGNAL TRANSFER METHOD

TECHNICAL FIELD

The present invention relates to a technology of signal transfer.

BACKGROUND ART

It is demanded to increase a data communication speed between chips of an information processing apparatus. The data communication speed is affected by a signal characteristic including the data. PTL 1 describes a feature that a calibration circuit including a replica circuit of the same configuration as that of a signal output driver of a semiconductor apparatus is prepared inside a chip in advance, a voltage condition for making a maximum current flow to the driver is given to the replica circuit, and the impedance of the replica circuit is controlled to be matched with a resistance value of an external resistance that is coupled to an external terminal.

CITATION LIST

Patent Literature

[PTL 1] Japanese Unexamined Patent Application Publication No. 2011-101143

SUMMARY OF INVENTION

Technical Problem

In the method of PTL 1, the calibration circuit including the replica circuit is required inside the chip, and further, the external resistance is also required. Therefore, this method has a problem of expanding a circuit scale, thus increasing cost.

Further, in a digital signal circuit including a driver (a transmission circuit of a signal) and a receiver (a reception circuit of a signal), there may exist a variation of a load capacity, in the receiver, due to a difference in an environment of a manufacturing stage, a manufacturer, or the like. Thus, conventionally, a parameter including a safety margin has been configured to the driver in consideration of the variation in the load capacity. However, because the safety margin is included, the data communication speed between the driver and the receiver is decreased.

Further, when the receiver is a storage apparatus including a flash memory (hereinafter referred to as "FM"), the FM has a characteristic that a bit error may naturally be generated in stored data.

Therefore, an object of the present invention is to improve a data communication speed related to signal transfer between a driver and a receiver in an environment where a variation may exist in a load capacity of the receiver. Further, another object of the present invention is, to find a parameter related to signal transmission of a driver that may improve the data communication speed as described above, when a side of a receiver includes storage media such as an FM in which a bit error may naturally be generated.

Solution to Problem

A storage system according to one embodiment of the present invention includes a controller part, a data storage part, and a signal transmission path that couples the controller part and the data storage part.

The controller part includes a driver that transmits a signal to the transfer path on the basis of a parameter for deciding a characteristic of the signal to be transmitted to the transfer path.

The data storage part includes a receiver that receives the signal transferred through the transfer path, a first storage area in which data is temporarily stored, and a second storage area in which the data temporarily stored in the first storage area is finally stored.

The controller part configures a parameter for a test to the driver, and the driver, on the basis of the configured parameter for a test, transmits a signal including write data to the transfer path.

The receiver receives the signal transmitted from the driver through the transfer path, and the data storage part writes the write data included in the signal received by the receiver into the first storage area.

The controller part reads the write data from the first storage area, determines whether or not a bit error exists in the read write data, and decides a parameter to be used for the driver on the basis of the result of the determination.

When the bit error does not exist in the write data read from the first storage area, the controller part may decide the parameter for a test configured to the driver as a parameter to be used for the driver, and when the bit error exists in the write data read from the first storage area, may configure a parameter for a test such that the communication speed of the write data is slower than that of a previously configured parameter for a test, and may execute, again, writing and reading of write data into and from the first storage area of the data storage part and the determination of the write data.

Advantageous Effects of Invention

According to the present invention, in an environment where a variation may exist in a load capacity of a receiver, a data communication speed between a driver and the receiver can be improved. Further, according to the present invention, when a side of the receiver includes storage media such as an FM in which a bit error can naturally be generated, it is possible to find a parameter of the driver that can improve the above-described data communication speed.

DESCRIPTION OF EMBODIMENTS

Hereinafter, some embodiments will be described with reference to the drawings.

[First Embodiment]

Figure 1:
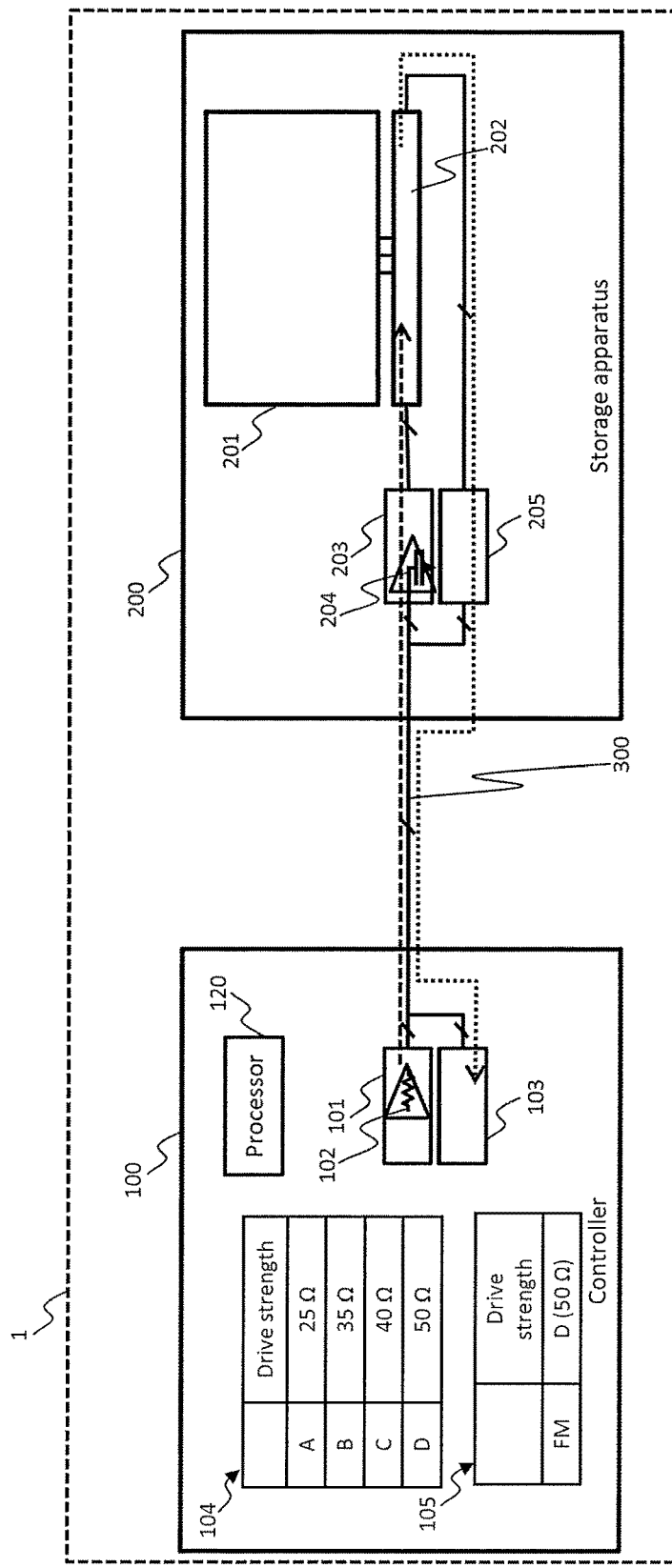
FIG. 1 is a configuration diagram of a signal transfer system according to a first embodiment.

FIG. 1 is a configuration diagram of a signal transfer system 1 according to a first embodiment.

The signal transfer system 1 includes a controller 100, a storage apparatus 200, and a transfer path 300 that couples the controller 100 and the storage apparatus 200. The controller 100 and the storage apparatus 200 perform data communication by sending and receiving an electric signal through the transfer path 300.

The controller 100 controls input/output of data to/from the storage apparatus 200. The controller 100 includes a processor 120, a reference register 104, a configuration register 105, a first driver 101, and a first receiver 103.

The first driver 101 is coupled to a terminal, on the side of the controller 100, of the transfer path 300 and can transmit a signal to the transfer path 300. When a drive strength (hereinafter, a configured drive strength) 102 configured to the first driver 101 is changed, a current value of a transmission signal of the first driver 101 is changed. When the processor 120 increases the configured drive strength 102, the current value of the transmission signal is increased, and when the processor 120 decreases the configured drive strength 102, the current value of the transmission signal of the first driver 101 is decreased. It should be noted that a term "on-resistance" can be used in place of a term "drive strength". That is, the "drive strength" is equivalent to the "on-resistance". For example, when it is assumed that the configured drive strength 102 is "24 mA" while power supply voltage is "1.5 V", "on-resistance R=1.5 V/24 mA=62.5Ω". That is, increasing the configured drive strength 102 is equivalent to decreasing the on-resistance, while decreasing the configured drive strength 102 is equivalent to increasing the on-resistance. The same applies to the following description. The first driver 101 may include FPGA (Field-Programmable Gate Array) and the like.

The first receiver 103 is coupled to a terminal, on the side of the controller 100, of the transfer path 300 and can receive a signal that has been transferred through the transfer path 300. That is, the first receiver 103 receives a signal transmitted from a second driver 205 on the side of the storage apparatus 200 which will be described below. The first receiver 103 may include the FPGA and the like. Further, the first driver 101 and the first receiver 103 may be configured as one FPGA.

With the reference register 104, a plurality of drive strengths which are configurable to the first driver 101 are registered in advance.

With the configuration register 105, one or more drive strengths which are configurable to the first driver 101 as the configured drive strength 102, are registered. When two or more drive strengths are registered with the configuration register 105, one drive strength selected, on the basis of a predetermined condition, out of the two or more drive strengths, is configured to the first driver 101 as the configured drive strength 102. This will be described in detail below (other embodiments are also included).

The processor 120 executes "training processing" described below to find an appropriate drive strength from the reference register 104. The processor 120 registers the appropriate drive strength with the configuration register 105. When data is sent (when a signal is transmitted), the processor 120 selects one drive strength out of one or more drive strengths registered with the configuration register 105 on the basis of the predetermined condition, and configures the one drive strength as the configured drive strength 102 to the first driver 101. Further, the processor 120 controls the first driver 101 to transmit a signal having data thereon to the transfer path 300. The processor 120 will be described in detail below.

The storage apparatus 200 includes a second receiver 203, a second driver 205, a memory cell array 201, and a data register 202. The memory cell array 200 includes a plurality of FM chips and can hold data. In the data register 202, data that is written into the memory cell array 200 or data that is read from the memory cell array 200 are temporarily stored. That is, the data register 202 can also be referred to as a buffer area of data that is input/output to/from the memory cell array 201.

The second receiver 203 is coupled to a terminal, on the side of the storage apparatus 200, of the transfer path 300, and receives a signal that has been transferred through the transfer path 300. That is, the second receiver 203 receives a signal transmitted from the first driver 101.

The second driver 205 is coupled to a terminal, on the side of the storage apparatus 200, of the transfer path 300, and transmits a signal to the transfer path 300. The second driver 205 and the second receiver 203 may be included as separate FPGAs or as one FPGA.

When it is seen from the first driver 101, the second receiver 203 includes a predetermined load capacity 204. The unit of the load capacity 204 is, for example, "F (Farad)". When impedance is not matched between the configured drive strength 102 of the first driver 101 and the load capacity 104 of the second receiver 203, the quality of a signal is deteriorated, thus resulting in a slower data communication speed. In this case, there may be a variation in the load capacity 204 that the second receiver 203 includes, due to a difference in an environment of a manufacturing stage, a manufacturer, or the like. In particular, such a tendency is higher when a manufacturer is different. Further, the length, thickness, or the like of the transfer path 300 also causes the variation in the load capacity 204 of the second receiver 203 when seen from the first driver 102. Accordingly, the most appropriate drive strength 102 may be different for each signal transfer system 1.

Therefore, the processor 120 performs processing for finding the most appropriate configured drive strength 102 of the first driver 101, which is adapted to the load capacity 204 of the second receiver 203. Processing of finding this most appropriate configured drive strength 102 is referred to as "training processing".

The training processing may be performed by a computer provided with the signal transfer system 1 when starting an operation. Further, the training processing may be performed at a prescribed period while the computer is operating. Further, the computer may perform the training processing on the basis of an indication from a user. The reason why the training processing is performed while the computer is operating as well as when starting an operation is because, when the computer is operated for a long time, various devices, including the first driver 101, the second receiver 203, and the transfer path 300, provided in the computer, are deteriorated over time, and there is a possibility that the most appropriate configured drive strength 102 is changed. Next, this training processing will be described in detail.

Figure 2:
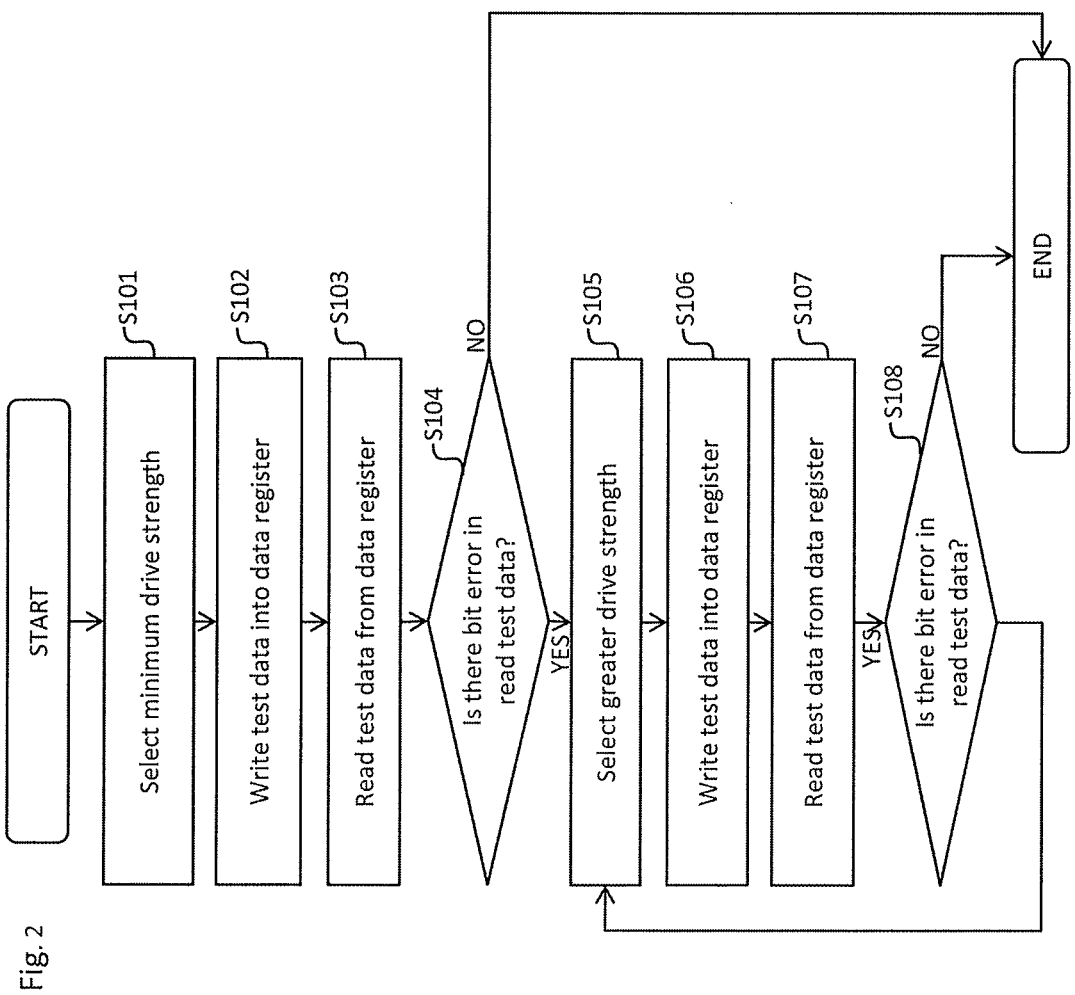
FIG. 2 is a flowchart showing an example of training processing.

FIG. 2 is a flowchart showing an example of the training processing.

The processor 120 of the controller 100 selects a minimum drive strength (a maximum on-resistance) out of a plurality of drive strengths included in a reference table 104 to configure the minimum drive strength to the first driver 101 as the configured drive strength 102 (S101).

The processor 120 performs processing of sending a write command related to test data to the storage apparatus 200. That is, the first driver 101 generates a signal including the write command related to the test data on the basis of the configured drive strength 102 configured in S101, and transmits the signal to the transfer path 300. The second receiver 203 of the storage apparatus 200 receives the signal. Further, the storage apparatus 200 extracts the test data from the received signal to store the test data into the data register 202 (S102).

When the storage apparatus 200 supports a write command to the effect that the test data is written only into the data register 202 and is not written into the memory cell array 201 (referred to as a "register write command") at the time, the processor 120 sends this register write command as a write command to the storage apparatus 200. When receiving the register write command, the storage apparatus 200 writes the test data only into the data register 202 and does not write the test data into the memory cell array 201. This prevents decrease in the life (the number of times of writing) of an FM chip.

When the storage apparatus 200 does not support the above-described register write command, the processor 120 sends a so-called ordinary write command. When receiving the ordinary write command, the storage apparatus 200 writes the test data into the memory cell array 201, and at the time, the test data is written also into the data register 202 as a cache. That is, in any case, the test data is written into the data register 202.

Next, the processor 120 performs processing of sending the read command related to the test data to the storage apparatus 200. That is, the first driver 101 generates a signal including the read command related to the test data on the basis of the configured drive strength 102 configured in S101, and transmits the signal to the transfer path 300. The second receiver 203 of the storage apparatus 200 receives the signal. Further, the storage apparatus 200 extracts the read command from the received signal, and reads the test data from the data register 202 on the basis of the read command. Further, the storage apparatus 200 performs processing of sending the test data to the controller 100. That is, the second driver 205 of the storage apparatus 200 generates a signal having the test data read from the data register 200 thereon on the basis of a predetermined drive strength, and transmits the signal to the transfer path 300. The first receiver 103 of the controller 100 receives the signal. Further, the processor 120 of the controller 100 extracts the test data from the received signal (S103).

When the storage apparatus 200 supports a read command to the effect that the test data is read only from the data register 202 and is not read from the memory cell array 201 (referred to as a "register read command") at the time, the processor 120 sends this register read command as a read command. The storage apparatus 200, when receiving the register read command, reads the test data from the data register 202 and does not read the test data from the memory cell array 201.

When the storage apparatus 200 does not support the above-described register read command, the processor 120 sends a so-called ordinary read command. When receiving the ordinary read command, the storage apparatus 200, first confirms whether or not the test data is stored in the data register 202, and when it is not stored, accesses to the memory cell array 202. In this case, the test data is stored in the data register 202 since it has just been written. Thus, the storage apparatus 200 reads the test data from the data register 202. That is, in any case, the test data is read from the data register 202.

The processor 120 compares the test data that is sent to the storage apparatus 200 in S102 (referred to as "write test data") with the test data received from the storage apparatus 200 in S103 (referred to as "read test data") to determine whether or not a bit error exists in the read test data. Alternatively, the processor 120 may determine whether or not the bit error exists in the read test data by putting the read test data through an ECC (Error Check and Correct) circuit (not shown) (S104).

When the bit error does not exist in the read test data (S104: NO), the processor 120 registers the configured drive strength selected in S101 with the configuration register 105 to end the processing (END). This drive strength registered with this configuration register 105 is used as the configured driver strength 102 of the first driver 101 in an actual operation.

When the bit error exists in the test data (S104: YES), the processor 120 selects a drive strength that is greater than that of the previous time (S105). For example, the processor 120 selects a drive strength that is one stage greater than the one selected previous time from the reference register 104. Specifically, when the configured drive strength 102 (the on-resistance) of the previous time is "50Ω", the processor 120 selects the drive strength (the on-resistance) of "40Ω" from the reference register 104 in S105.

The processor 120 performs processing similar to that in S102 to S103 to acquire the read test data (S106, S107). Then, the processor 120 performs processing similar to that in S104 to determine whether or not the bit error exists in the read test data (S108).

When the bit error does not exist in the read test data (S108: NO), the processor 120 registers the drive strength selected in S105 with the configuration register 105 to end the processing (END).

When the bit error exists in the read test data (S108: YES), the processor 120 returns to S105, selects the drive strength 102 that is further greater (S105), and repeats S105 to S108 until the bit error no longer exists in the test data. For example, the processor 102 sequentially selects 50Ω, 40Ω, 35Ω, 25Ω, and so on from the reference register 104 to find a drive strength at which the bit error no longer exists in the test data.

As a result, the processor 120 can find the most appropriate drive strength from the reference register 104 with respect to the load capacity 204 of the second receiver 203 of the storage apparatus 200.

That is, conventionally, the configured drive strength 102 is configured to be relatively high in consideration of the variation in the load capacity 204 of the second receiver 203, however, according to the present embodiment, it is possible to configure an appropriate configured drive strength 102 with respect to each of variations in the load capacity 204 of the second receiver 203. As a result, since it is possible to configure the configured drive strength 102 that is smaller than before, a data communication speed between the controller 100 and the storage apparatus 200 can be higher than before.

It is noted that, in consideration of a safety margin, the processor 120 may register a drive strength that is slightly smaller (one stage smaller in the reference register 104) than the drive strength at which the bit error does not exist in the read test data with the configuration register 105.

As mentioned above, the present embodiment is applicable also to the storage apparatus 200 that does not correspond to either one of the register write command and the register read command, however, when the storage apparatus 200 corresponds to these commands, it is better to use these commands because of the following reasons (1) to (3).

(1) The FM chip included in the memory cell array 201, by the nature of the FM chip, cannot avoid the occasional occurrence of a bit error. Thus, when the test data is written into and read from the FM chip, in a case where a bit error exists in the read test data, it is not possible to distinguish whether the bit error occurs due to the distortion of a signal waveform or the like, or due to the characteristic of the FM chip.

(2) Time required to write the test data into the memory cell array 201 is several hundred microseconds, which is longer compared to time required to write the test data into the data register 202. Accordingly, time required for the training processing can be shortened more by using the register write command.

(3) The upper limit of the number of writable (erasable) times exists in the FM chip included in the memory cell array 201 by the nature of the FM chip. Thus, when a normal write command is used, due to the upper limit, the life of the FM chip is shortened.

[Second Embodiment]

Figure 3:
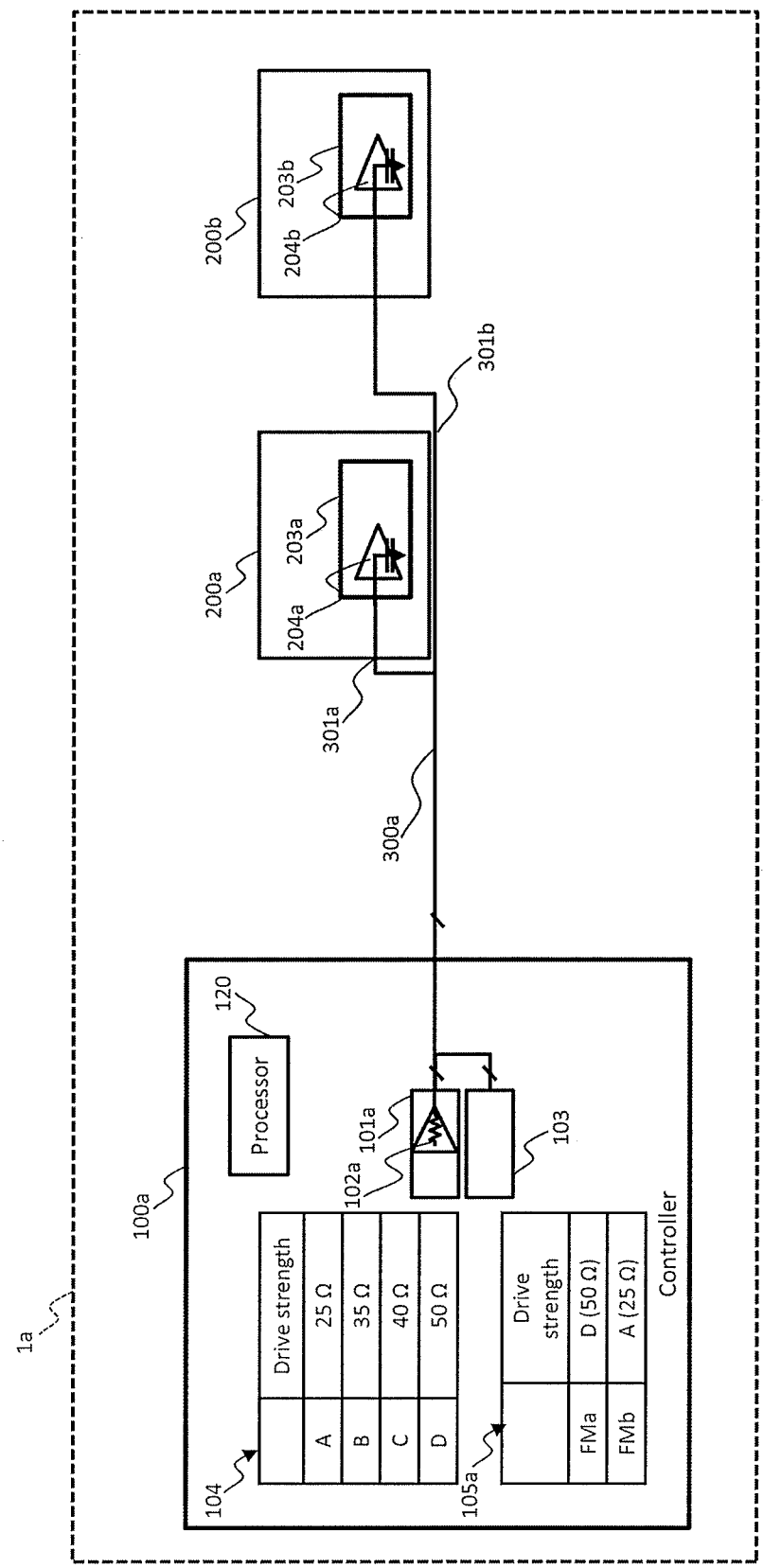
FIG. 3 is a configuration diagram of a signal transfer system according to a second embodiment.

FIG. 3 is a configuration diagram of a signal transfer system according to a second embodiment.

A signal transfer system 1*a* according to the second embodiment is different in that two or more storage apparatuses 200*a* and 200*b* (second receivers 203*a* and 203*b*) are coupled to the other side of a transfer path 300*a* compared to FIG. 1 in the first embodiment.

When load capacities 204*a* and 204*b* of each of the second receivers 203*a* and 203*b* are different from each other in the signal transfer system 1*a*, an appropriate drive strength with respect to each of the second receivers 203*a* and 203*b* is also different from each other.

Therefore, the processor 120 performs the training processing of the drive strength in much the same way as in the first embodiment with respect to each of the second receivers 203*a* and 203*b* to find an appropriate drive strength with respect to each of the load capacities 204*a* and 204*b*. Then, the processor 120 registers, with the configuration register 105*a*, the appropriate drive strength with respect to each of the load capacities 204*a* and 204*b* in association with the storage apparatuses 200*a* and 200*b*. That is, with the configuration register 105*a*, the appropriate drive strength corresponding to the storage apparatus 200*a* and the appropriate drive strength corresponding to the storage apparatus 200*b* are registered. Then, when writing data into the storage apparatus 200*a* in an actual operation, the processor 120 executes processing as shown in the following FIG. 4.

Figure 4:
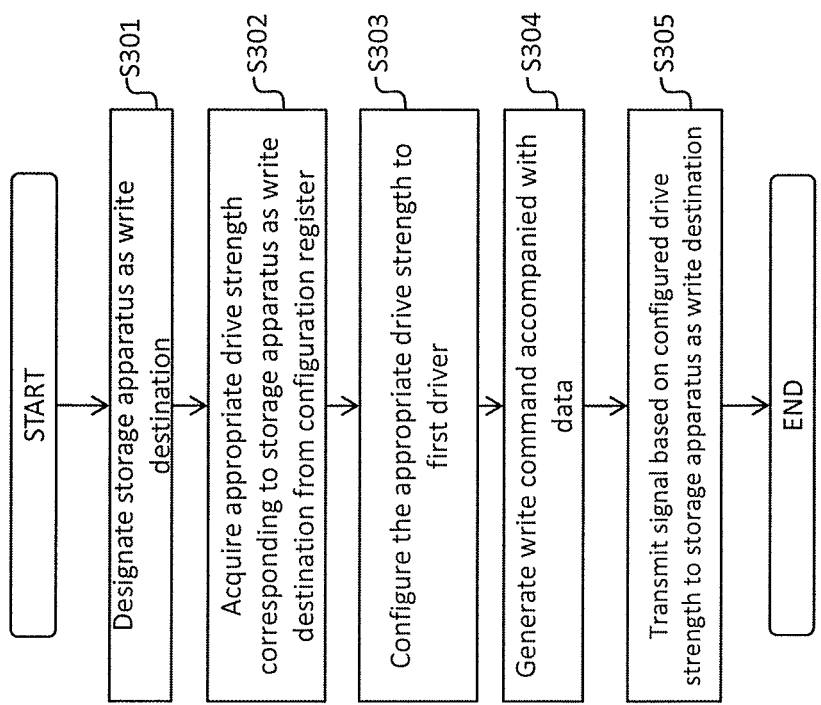
FIG. 4 is a flowchart showing processing of writing data into a flash memory in an actual operation.

FIG. 4 is a flowchart showing processing of writing data into the storage apparatus 200*a* in an actual operation.

The processor 120 designates, for example, the storage apparatus 200*a* as the write destination of the data (S301). The processor 120 acquires, from the configuration register 105*a*, a drive strength (for example, "50Ω") corresponding to the storage apparatus 200*a* as the write destination of the data (S302). The processor 120 configures this acquired "50Ω" drive strength, as a configured drive strength 102*a*, to a first driver 101*a* (S303).

The processor 120 generates a write command related to write data (S304). The first driver 101*a* generates a signal having the write command related to the write data thereon on the basis of the configured drive strength 102*a* "50Ω" that is configured in S303, and transmits the signal to the second receiver 203*a* of the storage apparatus 200*a* as the write destination (S305) (END). This write data is written into the storage apparatus 200*a*.

It is noted that, when the data is read from the storage apparatus 200*a*, the processing is almost similar except that the write command is changed to the read command, and thus, a description will be omitted. It is noted that, the description will be sometimes omitted similarly also in the following embodiments.

According to the above processing, the first driver 101*a* can transmit a signal at the appropriate configured drive strength 102*a* with respect to each of the load capacity 204*a* and the load capacity 204*b* even when the load capacity 204*a* and the load capacity 204*b* of each of the storage apparatus 200*a* and storage apparatus 200*b* are different from each other. As a result, it is possible to configure the configured drive strength 102*a* that is smaller than before to the first driver 101*a* when the data is sent to any one of the second receiver 203*a* and the second receiver 203*b*. Thus, a data communication speed between the controller 100 and each of the storage apparatus 200*a* and the storage apparatus 200*b* can be higher than before.

[Third Embodiment]

Figure 5:
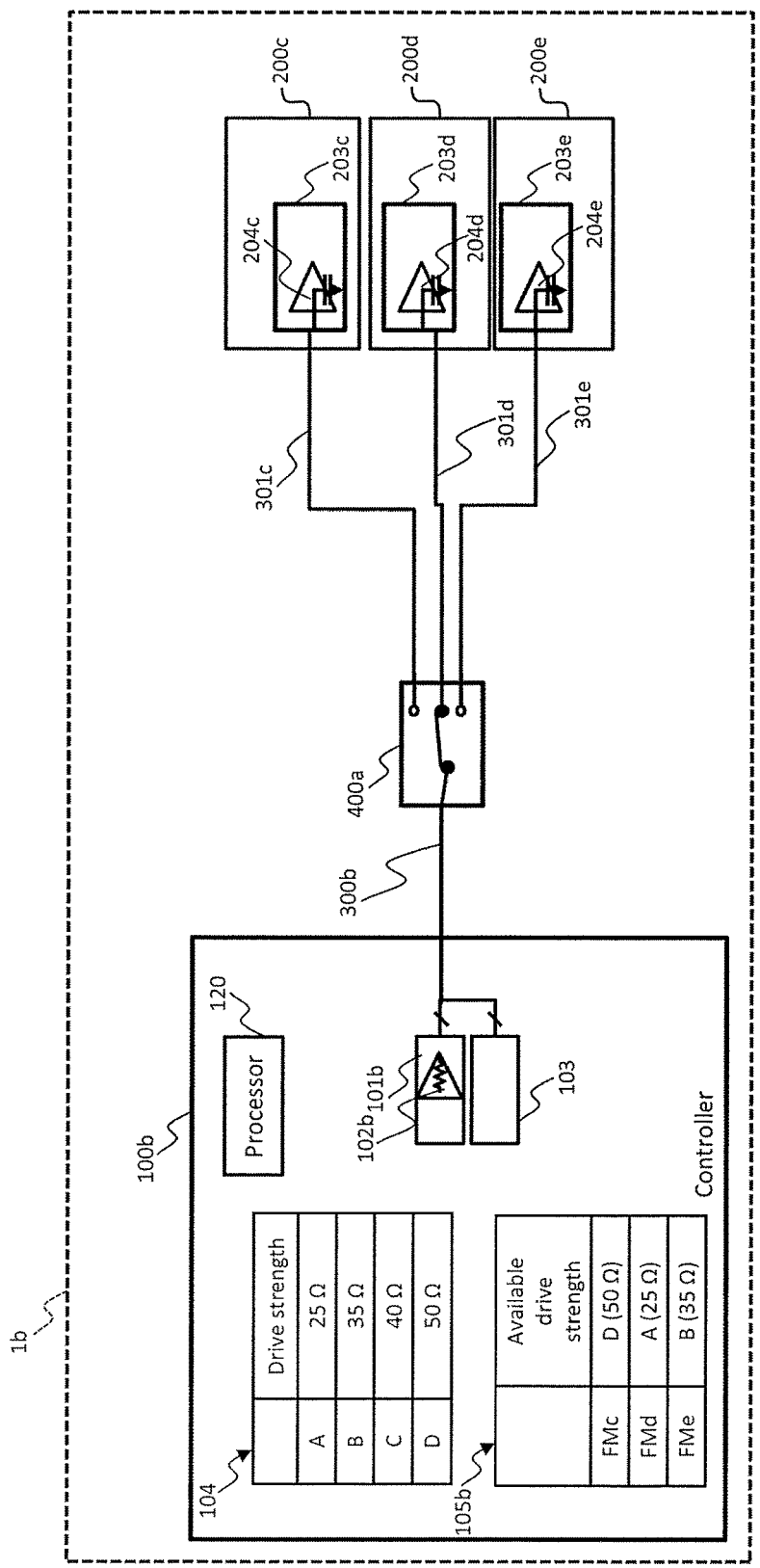
FIG. 5 is a configuration diagram of a signal transfer system according to a third embodiment.

FIG. 5 is a configuration diagram of a signal transfer system 1*b* according to a third embodiment.

The signal transfer system 1*b* according to the third embodiment is different in that a switch circuit 400*a* is included in the middle of a transfer path 300*b*, and this switch circuit 400*a* can switch the coupling destination of the transfer path 300*b* to any one of a storage apparatus 200*c*, a storage apparatus 200*d*, and a storage apparatus 200*e*, compared to FIG. 3 of the second embodiment.

Also in the third embodiment, the processor 120 performs the training processing of the drive strength in much the same way as in the second embodiment to find an appropriate drive strength with respect to load capacities 204*c*, 204*d*, and 204*e* of each of the storage apparatus 200*c* (a receiver 203*c*), the storage apparatus 200*d* (a receiver 203*d*), and the storage apparatus 200*e* (a receiver 203*e*). For example, when finding the appropriate drive strength corresponding to the storage apparatus 200*c*, the processor 120 switches the switch circuit 400*a* such that the controller 100*b* is coupled to the storage apparatus 200*c* one to one to perform the training processing. Then, the processor 120 registers, with the configuration register 105*b*, the appropriate drive strength found by the training processing in association with the storage apparatus 200*c*. The processor 120 finds the appropriate drive strength in much the same way as also to the other storage apparatus 200*d* and the storage apparatus 200*e* to register the appropriate drive strength with the configuration register 105*b*.

The processor 120 executes the following processing when writing data into the storage apparatus 200*c* in an actual operation. In much the same way as in the flowchart as shown in FIG. 4, the processor 120 acquires a drive strength corresponding to the storage apparatus 200*c* as a write destination (for example, "50Ω") from the configuration register 105*b* to configure the drive strength as a configured drive strength 102*b* to a first driver 101*b*. Then, the processor 120 switches the coupling destination of the switch circuit 400*a* to the storage apparatus 200*c* as the write destination. The first driver 101*b* generates a signal having a write command related to write data thereon on the basis of the configured drive strength 102*b* "50Ω" to transmit the signal to the storage apparatus 200*c* as the write destination. This write data is written into the storage apparatus 200*c*.

According to the above processing, each of the second receivers 203*c*, 203*d*, and 203*e* can receive a signal waveform having higher quality than that in the case of the second embodiment. The reason is that, at the time of signal transfer, the switch circuit 400a allows the first driver 101b and any one of the second receivers 203c, 203d, and 203e to have a one-to-one correspondence relation. Thus, a data communication speed between the controller 100b and each of the storage apparatuses 200c, 200d, and 200e can be higher than before.

[Fourth Embodiment]

Figure 6:
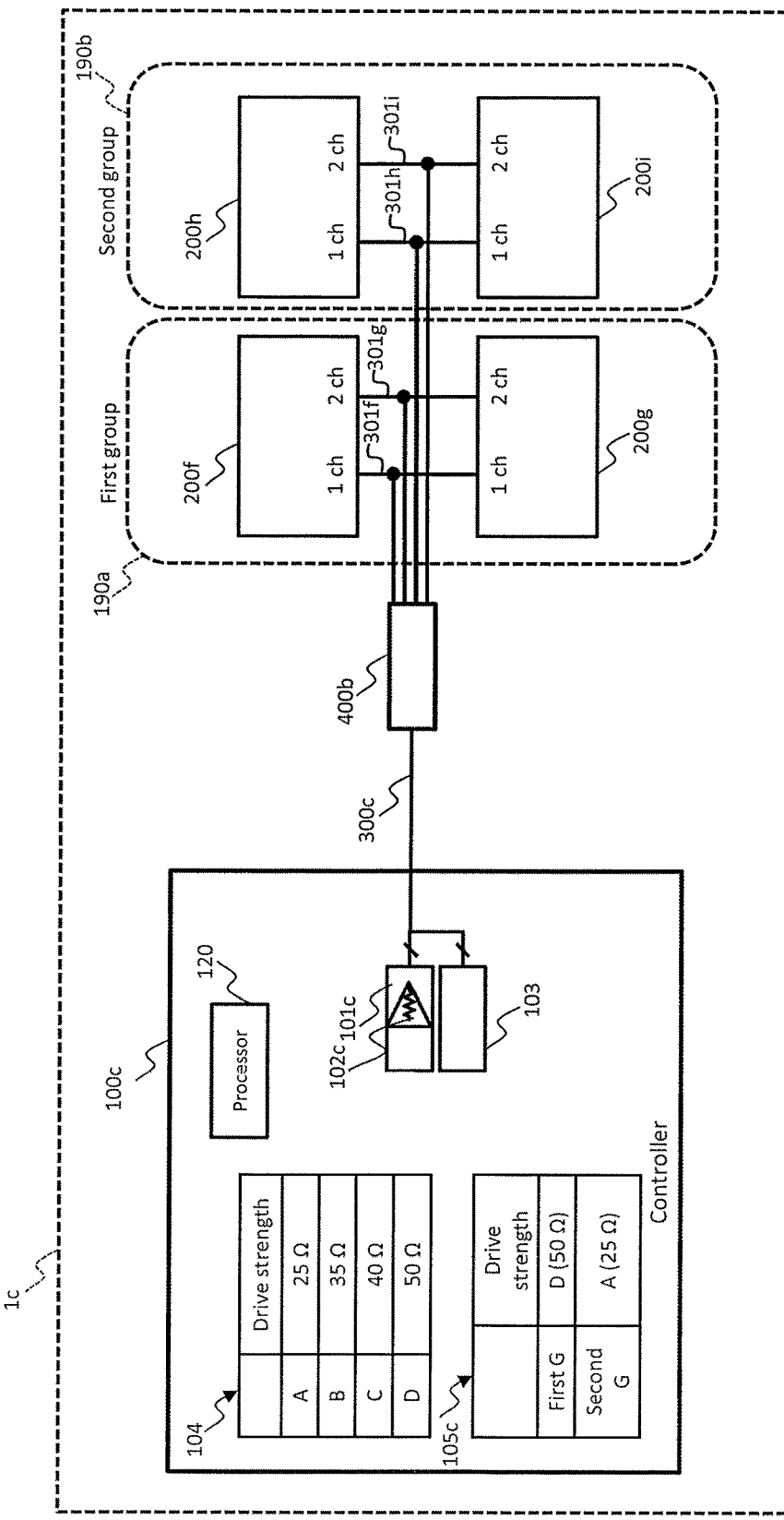
FIG. 6 is a configuration diagram of a signal transfer system according to a fourth embodiment.

FIG. 6 is a configuration diagram of a signal transfer system 1c according to a fourth embodiment.

In the signal transfer system is according to the fourth embodiment, a controller 100c is coupled to one side of a transfer path 300c while a switch circuit 400b is coupled to the other side of the transfer path 300c. Each of storage apparatuses 200f, 200g, 200h, and 200i includes a first channel and a second channel as the coupling destination of the transfer path 300c. A transfer path 301f is coupled to the first channel of each of the storage apparatus 200f and the storage apparatus 200g, and the other side of the transfer path 301f is coupled to the switch circuit 400b. Similarly, a transfer path 301g is coupled to the second channel of each of the storage apparatus 200f and the storage apparatus 200g, the transfer path 300h is coupled to the first channel of each of the storage apparatus 200h and the storage apparatus 200i, and a transfer path 300i is coupled to the second channel of each of the storage apparatus 200h and the storage apparatus 200i. Each of the storage apparatuses 200f to 200i includes the second receiver (not shown) in much the same way as in the above-mentioned embodiment.

The switch circuit 400b switches the coupling destination of the transfer path 300c to any one of the transfer paths 301f, 301g, 301h, and 301i. In this case, the storage apparatus 200f and the storage apparatus 200g are referred to as a first group, while the storage apparatus 200h and the storage apparatus 200i are referred to as a second group.

In the fourth embodiment, in the training processing of the drive strength, the processor 120 finds an appropriate drive strength corresponding to the first group and an appropriate drive strength corresponding to the second group. That is, the processor 120 does not need to find an appropriate drive strength corresponding to each of the storage apparatuses 200f, 200g, 200h, and 200i. The reason is as follows.

In constituting a storage device including a plurality of storage apparatuses, there may be a configuration in which the storage apparatus 200f is arranged on the surface of a substrate, the storage apparatus 200g is arranged on the rear surface of the substrate, the transfer path 301f is coupled to the first channel of each of the storage apparatus 200f and the storage apparatus 200g, and the transfer path 301g is coupled to the second channel of each of the storage apparatus 200f and the storage apparatus 200g. This is for making effective use of the square measure of the substrate that is limited. When having such a configuration, for the storage apparatus 200f and the storage apparatus 200g sharing the transfer path 301f and the transfer path 301g, normally, ones including a similar load capacity are employed. The same applies to the storage apparatuses 200h and 200i.

However, the ones including the similar load capacity are not necessarily employed for the storage apparatus 200f and the storage apparatus 200h which do not belong to the same group. Therefore, in the fourth embodiment, the processor 120 finds the appropriate drive strength corresponding to each of the first group and the second group in the training processing of the drive strength. When finding the appropriate drive strength corresponding to the first group, the processor 120 switches the coupling destination of the switch circuit 400b to any one of the transfer path 301f or 301g to perform the training processing. Then, the processor 120 registers, with a configuration register 105c, the appropriate drive strength that is found by the training processing in association with the first group. The processor 120 similarly finds the appropriate drive strength corresponding to the second group, and registers the appropriate drive strength with the configuration register 105c.

When writing data into the storage apparatus 200f through the first channel of the storage apparatus 200f in an actual operation, the processor 120 executes the following processing. In much the same way as in the flowchart as shown in FIG. 4, the processor 120 acquires an appropriate drive strength (for example, "50Ω") corresponding to the first group to which the storage apparatus 200f as a write destination belongs from the configuration register 105c to configure the appropriate drive strength as a configured drive strength 102c to a first driver 101c. Then, the processor 120 switches the coupling destination of the switch circuit 400b to the transfer path 301f. The first driver 101c generates a signal having a write command according to write data thereon on the basis of the configured drive strength 102c "50Ω" to transmit the signal to the first channel of an FM100f. This write data is written into the storage apparatus 200f.

According to the above processing, in addition to the effect mentioned in the first embodiment to the third embodiment, the following effect is produced. That is, since the appropriate drive strength corresponds to each of groups 190a and 190b, not for each of the storage apparatuses 200f, 200g, 200h, and 200i, in data sending processing at the time of the actual operation, the frequency of changing the configured drive strength 102c of the first driver 101c is decreased. Further, the number of registers to be secured as the configuration register 105c can also be reduced.

[Fifth Embodiment]

Figure 7:
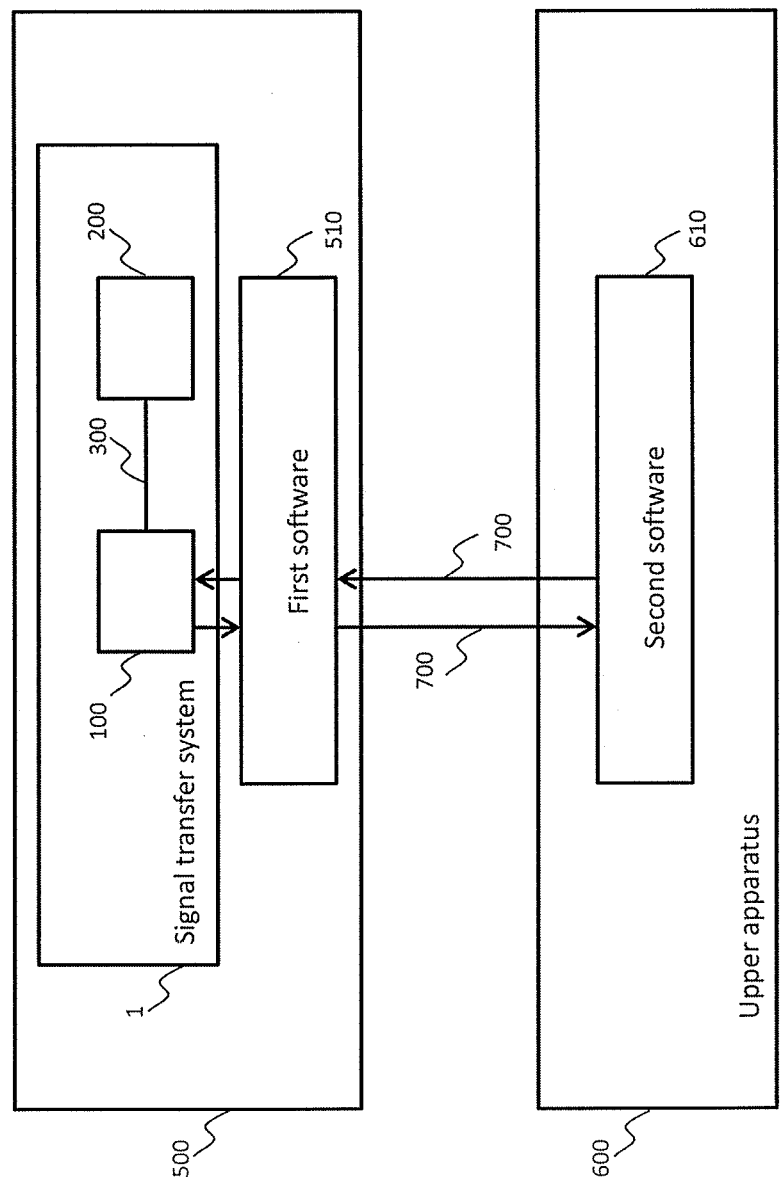
FIG. 7 is a configuration diagram of a system according to a fifth embodiment.

FIG. 7 is a configuration diagram of a computer system according to a fifth embodiment. In the fifth embodiment, a description will be given to a computer system that controls the signal transfer system 1 from the outside.

In FIG. 7, the computer system includes a storage module 500 that is capable of storing data, and an upper apparatus 600 that controls the storage module 500, and the storage module 500 is coupled to the upper apparatus 600 by a predetermined communication network 700 (or a cable).

The storage module 500 includes the signal transfer system 1, and first software 510 that controls the signal transfer system 1.

An example of the upper apparatus 600 includes a host controller, a storage apparatus, or a server apparatus. The upper apparatus 600 includes second software 610 that operates in cooperation with the first software 510 of the storage module 500.

The first software 510 provides API (Application Programming Interface) for configuring, changing, and referring to the configured drive strength 102 of each driver included in the signal transfer system 1, from the outside.

Second software 610 of the upper apparatus 600 can configure, change, and refer to the configured drive strength 102 of a predetermined driver of the signal transfer system 1 by utilizing this API. The second software 610 may provide a user with UI (User Interface) with which the configured drive strength 102 of a desired driver included in the storage module 500 can be easily configured, changed, and referred to.

The above-mentioned embodiments of the present invention are illustrative for the description of the present invention, and it is not intended to limit the scope of the present invention to these embodiments only. A person skilled in the art is capable of implementing the present invention in various other modes without departing from the spirit of the present invention.

For example, a parameter affecting signal quality includes a slew rate, a skew adjustment value, an ODT (On Die Termination) resistance value, and the like in addition to the above-mentioned configured drive strength (the on-resistance). The controller 100 may include a reference register in which a selectable value is registered with respect to each of the slew rate, the skew adjustment value, and the ODT resistance value.

The slew rate is a value that indicates an inclination (steepness) of the waveform of rising and falling of a signal. The slew rate is represented as, for example, "V/µs", and the steeper the inclination of the signal waveform is, the larger the value is.

The processor 120 may perform the training processing related to the slew rate in much the same way as the training processing of the drive strength mentioned above, and find an appropriate slew rate. For example, the processor 120 may change the slew rate from a small value to a large value in stages out of values registered with the reference register of the slew rate to find the appropriate slew rate at which a bit error no longer exists in the read test data. Then, the processor 120 may configure the appropriate slew rate to the first driver 101 when sending data in an actual operation, and the first driver 101 may transmit a signal in accordance with the configured slew rate.

A skew indicates a gap between a signal including data and a strobe signal. Even when the first driver 101 simultaneously sends the signal including data and the strobe signal, these two signals do not necessarily arrive at the second receiver 203 simultaneously due to a difference in the length of the transfer path, the variation in the characteristic of the transfer path, or the like. The gap between the two signals is the skew. The value of the skew is represented in, for example, "microseconds". Reducing the skew in the second receiver 203 is referred to as deskewing. For example, by shifting sending timing of the signal including the data from that of the strobe signal by an appropriate time, the skew in the second receiver 203 can be reduced.

The processor 120 may perform the training processing related to the skew adjustment value in much the same way as the training processing of the drive strength mentioned above to find the appropriate time that shifts the sending timing of the two signals (that is, the skew adjustment value). For example, the processor 120 changes the skew adjustment value from a small value to a large value in stages out of values registered with the reference register of the skew adjustment value to find the appropriate skew adjustment value at which a bit error no longer exists in the read test data. Then, the processor 120 configures the appropriate skew adjustment value to the first driver 101 when sending data in an actual operation, and the first driver 101 may transmit a signal in accordance with the configured skew adjustment value.

The ODT is a terminating resistance included in the second receiver 203. The terminating resistance is included to prevent a signal from reflecting in the second receiver 203. The magnitude of this terminating resistance (that is, the ODT resistance value) may be changeable.

The processor 120 may perform the training processing related to the ODT resistance value in much the same way as the training processing of the drive strength mentioned above to find an appropriate ODT resistance value. For example, the processor 120 changes the ODT resistance value from a large value to a small value in stages out of values registered with the reference register of the ODT resistance value to find the appropriate ODT resistance value at which a bit error no longer exists in the read test data. Then, the processor 120 configures the appropriate ODT resistance value to the second receiver 203 when sending data in an actual operation, and the second receiver 203 may receive a signal in accordance with the configured ODT resistance value.

The processor 120 may find the appropriate value of each of the drive strength, the slew rate, the skew adjustment value, and the ODT resistance value by the training processing to register all these appropriate values with a predetermined configuration register. Then, the processor 120 may configure all these appropriate values to the first driver 101 and the second receiver 203 when sending data in an actual operation, and control the first driver 101 to transmit a signal. As a result, the drive strength 102 that is smaller than before can be configured to the first driver 101. Thus, the data communication speed between the controller 100 and the storage apparatus 200 can be higher than before.

On the basis of the first to fifth embodiments described so far, for example, the following expressions are possible.

<Expression 1>

A storage system, comprising: a controller part, a data storage part, and a transfer path of a signal configured to couple the controller part and the data storage part, in which the controller part includes a driver configured to transmit a signal to the transfer path on the basis of a parameter for deciding a characteristic of the signal to be transmitted to the transfer path, the data storage part includes a receiver configured to receive the signal transferred through the transfer path, a first storage area in which data is temporarily stored, and a second storage area in which the data temporarily stored in the first storage area is finally stored, the controller part is configured to configure a parameter for a test to the driver, and the driver is configured to transmit the signal including write data to the transfer path on the basis of the configured parameter for a test, the receiver is configured to receive the signal transmitted from the driver through the transfer path, and the data storage part is configured to write the write data included in the signal received by the receiver into the first storage area, and the controller part is configured to read the write data from the first storage area, determine whether or not a bit error exists in the read write data, and decide a parameter to be used for the driver on the basis of a result of the determination.

<Expression 2>

The storage system according to expression 1, in which the controller part, when the bit error does not exist in the write data read from the first storage area, is configured to decide the parameter for a test configured to the driver as a parameter to be used for the driver, when the bit error exists in the write data read from the first storage area, is configured to configure a parameter for a test such that a communication speed of the write data is slower than that of a previously configured parameter for a test, and execute, again, writing and reading of the write data into and from the first storage area of the data storage part and the determination of the write data.

<Expression 3>

The storage system according to the expression 1 or 2, in which the second storage area includes non-volatile storage media that can generate a bit error in stored data.

<Expression 4>

The storage system according to any one of expressions 1 to 3, in which a first data storage part and a second data storage part, as the data storage part, are coupled to the transfer path, and the controller part, is configured to execute writing, reading, and the determination of the write data with respect to each of the first data storage part and the second data storage part, decide a first parameter to be used for the first data storage part and a second parameter to be used for the second data storage part, and when sending data to the first data storage part, is configured to use the first parameter for the driver, and when sending data to the second memory part, is configured to use the second parameter for the driver.

<Expression 5>

The storage system according to the expression 4, comprising a switch part configured to switch a coupling destination, on a side of the data storage part, of the transfer path to any one of the first data storage part and the second data storage part, in which the controller part, is configured to switch a coupling destination of the switch part to the first data storage part, execute writing, reading, and the determination of the write data, decide the first parameter to be used for the first data storage part, switch the coupling destination of the switch part to the second data storage part, execute writing, reading, and the determination of the write data and decide the second parameter to be used for the second data storage part, when sending data to the first data storage part, is configured to switch the coupling destination of the switch part to the first data storage part and use the first parameter for the driver, and when sending data to the second data storage part, is configured to switch the coupling destination of the switch part to the second data storage part and use the second parameter for the driver.

<Expression 6>

The storage system according to any one of expressions 1 to 3, comprising a switch part configured to switch the coupling destination, on the side of the data storage part, of the transfer path to any one of the first data storage part and the second data storage part, and a third data storage part and a fourth data storage part, in which the controller part, is configured to switch the coupling destination of the switch part to the first data storage part and the second data storage part, execute writing, reading, and the determination of the write data, with respect to either one of the first data storage part and the second storage part, decide a first parameter to be used for the first data storage part and the second data storage part, switch the coupling destination of the switch part to the third data storage part and the fourth data storage part, execute writing, reading, and the determination of the write data with respect to either one of the third data storage part and the fourth data storage part, and decide a second parameter to be used for the third data storage part and the fourth data storage part, when sending data to the first data storage part or the second data storage part, is configured to switch the coupling destination of the switch part to the first data storage part and the third data storage part and use the first parameter for the driver, and when sending data to the third data storage part or the fourth data storage part, is configured to switch the coupling destination of the switch part to the third data storage part and the fourth data storage part and use the second parameter for the driver.

<Expression 7>

The storage system according to the expression 3, in which the parameter is a drive strength that decides a current value of a signal outputted by the driver, and configuring a parameter for a test such that the communication speed is slower means configuring a drive strength such that the current value is larger than that of a previously configured drive strength.

<Expression 8>

The storage system according to any one of expressions 1 to 7, in which the parameter is a slew rate adjustment value that decides a slew rate of the signal outputted by the driver, and configuring a parameter for a test such that the communication speed is slower means configuring a slew rate adjustment value such that the slew rate is larger than that of a previously configured slew rate adjustment value.

<Expression 9>

The storage system according to any one of expressions 1 to 7, in which the parameter is a resistance value that decides a magnitude of a terminating resistance related to the receiver, and configuring a parameter for a test such that the communication speed is slower means configuring a resistance value that is larger than a previously configured resistance value.

<Expression 10>

The storage system according to any one of expressions 1 to 9, further comprising an interface part configured to output the parameter configured to the driver to the outside.

<Expression 11>

A method of transferring a signal between a controller part that is coupled to one side of a transfer path and a data storage part that is coupled to the other side of the transfer path, in which the controller part includes a driver that transmits a signal to the transfer path on the basis of a parameter for deciding a characteristic of the signal to be transmitted to the transfer path, the data storage part includes a receiver that receives the signal transferred through the transfer path, a first storage area in which data is temporarily stored, and a second storage area in which the data temporarily stored in the first storage area is finally stored, the controller part configures a parameter for a test to the driver, the driver transmits a signal including write data to the transfer path on the basis of the configured parameter for a test, the receiver receives the signal transmitted from the driver through the transfer path, the data storage part writes the write data included in the signal received by the receiver into the first storage area, and the controller part reads the write data from the first storage area, determines whether or not a bit error exists in the read write data, and decides a parameter to be used for the driver on the basis of a result of the determination.

In the above-mentioned expressions, the controller part corresponds to the controllers 100, 100a, 100b, and 100c. The driver corresponds to the first driver 101. The data storage part corresponds to the storage apparatuses 200, and 200a to 200i. The first storage area corresponds to the data register 202. The second storage area corresponds to the memory cell array 201. The receiver corresponds to the second receivers 203, and 203a to 203e. The transfer path corresponds to the transfer paths 300, 300a to 300c, and 301a to 301i. The parameter for a test corresponds to the drive strength registered with the reference register 104. Alternatively, the parameter for a test corresponds to the slew rate, the skew adjustment value, or the ODT resistance value registered with a predetermined reference register.

REFERENCE SIGNS LIST

1, 1a, 1b, 1c: signal transfer system, 100, 100a to 100c: controller, 120: processor, 101: first driver, 102: drive strength (on-resistance), 200, 200a to 200i: flash memory, 203, 203a to 203e: second receiver

The invention claimed is:

1. A storage system, comprising: a controller part, a data storage part, and a transfer path of a signal configured to couple the controller part and the data storage part, wherein
the controller part includes a driver configured to transmit the signal to the transfer path on the basis of a parameter for deciding a characteristic of the signal to be transmitted to the transfer path,
the data storage part includes a first storage area in which data including write data is temporarily stored, and a second storage area in which the data, including the write data, temporarily stored in the first storage area is finally stored,
the controller part is configured to transmit the signal for a test including the write data to the transfer path,
the data storage part is configured to receive the signal for the test transmitted from the driver through the transfer path, write and hold the write data included in the signal for the test received into the first storage area, receive a read command from the controller part, read the write data held in the first storage area and send the read write data to the controller part, and
the controller part compares the write data transmitted from the data storage part and held in the first storage area with the read write data sent to the controller part, and determines the parameter to be used for the driver on the basis of the read write data.

2. The storage system according to claim 1, wherein
the controller part,
compare the write data transmitted from the data storage part and held in the first storage area with the read write data sent to the controller part, determine whether or not a bit error exists in the read write data,
when the bit error does not exist in the read write data from the first storage area, is configured to determine the parameter for the test configured to the driver as the parameter to be used for the driver,
when the bit error exists in the read write data from the first storage area, is configured to configure another parameter for another test such that a communication speed of the write data is slower than that of the parameter for the test, and
transmit a second signal to the transfer path on the basis of the another parameter,
data storage part receives the second signal for the another test, writes and holds the write data included in the second signal for the another test received into the first storage area, receive a second read command from the controller part, reads the write data held in the first storage area for a second time and sends second read write data to the controller part, and
the controller part compares the write data transmitted from the data storage part and held in the first storage area with the second read write data sent to the controller part, and determines the parameter to be used for the driver on the basis of the second read write data.

3. The storage system according to claim 2, wherein
the second storage area includes non-volatile storage media that can generate the bit error in the write data.

4. The storage system according to claim 3, wherein
the data storage part may include a first data storage part and a second data storage part, wherein the first data storage part and the second data storage part are each connected to the transfer path, and
the controller part,
is configured to execute writing and reading of the write data with respect to each of the first data storage part and the second data storage part, determine a first data parameter to be used for the first data storage part and a second data parameter to be used for the second data storage part, and
when sending the write data to the first data storage part, is configured to use the first data parameter for the driver, and when sending the write data to the second data storage part, is configured to use the second data parameter for the driver.

5. The storage system according to claim 4, comprising
a switch part configured to switch a coupling destination, on a side of the data storage part, of the transfer path to any one of the first data storage part and the second data storage part, wherein
the controller part,
is configured to switch the coupling destination of the switch part to the first data storage part, execute writing, reading, and determine the first data parameter to be used for the first data storage part, switch the coupling destination of the switch part to the second data storage part, execute writing, reading, and determine the second data parameter to be used for the second data storage part,
when sending write data to the first data storage part, is configured to switch the coupling destination of the switch part to the first data storage part and use the first data parameter for the driver, and
when sending write data to the second data storage part, is configured to switch the coupling destination of the switch part to the second data storage part and use the second data parameter for the driver.

6. The storage system according to claim 3, comprising
a switch part configured to switch a coupling destination, on a side of the data storage part, of the transfer path to any one of a first group including a first data storage part and a second data storage part, and a second group including a third data storage part and a fourth data storage part, wherein
the controller part,
is configured to switch the coupling destination of the switch part to the first group, execute writing, reading, and determine a first data parameter to be used for the first group, switch the coupling destination of the switch part to the second group, execute writing, reading, and determine a second data parameter to be used for the second group, when sending the write data to the first data storage part or the second data storage part, is configured to switch the coupling destination of the switch part to the first group and use the first data parameter for the driver, and when sending data to the third data storage part or the fourth data storage part, is configured to switch the coupling destination of the switch part to the second group and use the second data parameter for the driver.

7. The storage system according to claim 3, wherein the parameter is a drive strength that decides a current value of the signal outputted by the driver, and configuring the parameter for the test such that the communication speed is slower means configuring the drive strength such that the current value is larger than that of a previously configured drive strength.

8. The storage system according to claim 7, further comprising an interface part configured to output the parameter configured to the driver via an external cable.

9. The storage system according to claim 3, wherein the parameter is a slew rate adjustment value that decides a slew rate of the signal outputted by the driver, and configuring the parameter for the test such that the communication speed is slower means configuring the slew rate adjustment value such that the slew rate is larger than a previously configured slew rate adjustment value.

10. The storage system according to claim 3, wherein the parameter is a resistance value that decides a magnitude of a terminating resistance related to the controller part, and configuring the parameter for the test such that the communication speed is slower means configuring the resistance value that is larger than a previously configured resistance value.

11. The storage system according to claim 1, further comprising the controller part is configured to transmit a request to hold the write data included in the signal for the test into the first storage area, when transmitting the signal for the test to the transfer path.

12. The storage system according to claim 1, further comprising the controller part is configured to transmit a request to read data that has never been stored in the second storage area, when transmitting the read request to the transfer path.

13. A method of transferring a signal between a controller part that is coupled to one side of a transfer path and a data storage part that is coupled to another side of the transfer path, wherein the controller part includes a driver that transmits the signal to the transfer path on the basis of a parameter for deciding a characteristic of the signal to be transmitted to the transfer path, the data storage part includes a first storage area in which data including write data is temporarily stored, and a second storage area in which the data, including the write data, temporarily stored in the first storage area is finally stored, the controller part transmits the signal for a test including the write data to the transfer path, the data storage part receives the signal for the test transmitted from the driver through the transfer path, writes and holds the write data included in the signal for the test received into the first storage area, receives a read command from the controller part, reads the write data held in the first storage area and sends the read write data to the controller part, and the controller part compares the write data transmitted from the data storage part and held in the first storage area with the read write data sent to the controller part, and determines the parameter to be used for the driver on the basis of the read write data.

* * * * *